United States Patent
Mohammadi et al.

(10) Patent No.: US 7,248,081 B2
(45) Date of Patent: Jul. 24, 2007

(54) SLICER WITH LARGE INPUT COMMON MODE RANGE

(75) Inventors: Behnam Mohammadi, Irvine, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 29 days.

(21) Appl. No.: 11/204,113

(22) Filed: Aug. 16, 2005

(65) Prior Publication Data

US 2007/0008016 A1 Jan. 11, 2007

Related U.S. Application Data

(60) Provisional application No. 60/697,387, filed on Jul. 8, 2005.

(51) Int. Cl.
H03K 5/22 (2006.01)
(52) U.S. Cl. .......................................... 327/65; 330/258
(58) Field of Classification Search ............ 327/65–67; 330/258
See application file for complete search history.

(56) References Cited

U.S. PATENT DOCUMENTS

| | | | | |
|---|---|---|---|---|
| 4,333,058 A | * | 6/1982 | Hoover | 330/253 |
| 5,670,910 A | * | 9/1997 | Kato | 330/253 |
| 5,729,178 A | * | 3/1998 | Park et al. | 330/258 |
| 5,764,086 A | * | 6/1998 | Nagamatsu et al. | 327/65 |
| 5,963,053 A | * | 10/1999 | Manohar et al. | 326/60 |
| 6,005,440 A | * | 12/1999 | Okamoto | 330/253 |
| 6,051,999 A | * | 4/2000 | To et al. | 327/66 |
| 6,060,940 A | * | 5/2000 | Chiozzi | 327/437 |
| 6,127,854 A | * | 10/2000 | Illegems | 327/66 |
| 6,252,432 B1 | * | 6/2001 | Freitas | 327/65 |
| 6,252,435 B1 | * | 6/2001 | Wu et al. | 327/65 |
| 6,801,059 B2 | * | 10/2004 | Lee | 327/65 |
| 6,864,725 B2 | * | 3/2005 | Cowles et al. | 327/108 |

* cited by examiner

Primary Examiner—Kenneth B. Wells
(74) Attorney, Agent, or Firm—Squire, Sanders & Dempsey L.L.P.

(57) ABSTRACT

A slicer with large input common mode range is provided. The slicer includes an input stage coupled to receive an input signal, a current source for providing current for the input stage, a self-biased load coupled to the input stage to provide an initial output signal, and an inverter for inverting the initial output signal to provide a final output signal. The input stage includes a first circuit including a plurality of transistors and a complimentary circuit including a plurality of transistors. When a low common mode input voltage causes the transistors of the first circuit to turn off, the transistors of the complimentary circuit will take over to accomplish the same task as the first circuit.

10 Claims, 4 Drawing Sheets

SLICER WITH LARGE INPUT COMMON MODE RANGE

CROSS-REFERENCE TO RELATED APPLICATIONS

This application claims priority of U.S. Provisional Patent Application Ser. No. 60/697,387, filed on Jul. 8, 2005. The subject matter of this earlier filed application is hereby incorporated by reference.

BACKGROUND OF THE INVENTION

1. Field of the Invention

This invention relates to signal processing and, more specifically, a signal slicer with large input common mode range.

2. Description of the Related Art

A comparator is a circuit, such as a differential amplifier, that compares two inputs and produces an output that is a function of the result of the comparison. A slicer is a type of comparator which converts an analog input signal into a rail-to-rail or digital output signal.

The slicer may incorporate a threshold detection mechanism to generate a digital high or low output signal when the value of the input signal corresponds to a high or low threshold value. A conventional differential slicer generates a high or low output signal based on the zero crossing of the differential input signal.

A conventional slicer may incorporate a self-biasing resistor and an AC coupling capacitor. The capacitor removes the DC component of the input signal, and the self-biasing property of the inverter adjusts the DC level of the input signal to a level that causes the output of the inverter to switch when the input signal is at the appropriate level.

Traditionally, a slicer may require relatively large capacitors and resistors, and may not efficiently process low frequency signals. Therefore, there is a need for enhanced slicing circuits.

BRIEF DESCRIPTION OF THE DRAWINGS

For proper understanding of the invention, reference should be made to the accompanying drawings, wherein.

DETAILED DESCRIPTION OF THE PREFERRED EMBODIMENT(S)

The present invention provides, according to one embodiment, a slicer with large input common mode range. The slicer converts an analog input signal into a rail-to-rail or digital output signal. The common mode signal refers to the average of the p-side and n-side of a differential signal. While common mode rejection is a term used to describe the ability of a differential amplifier to reject, suppress, or zero-out common mode signals.

Conventional slicer circuits may require relatively large capacitors and resistors, while not providing efficient processing of low frequency signals. The present invention, on the other hand, provides the advantage of reduced die area in combination with a large input common mode range which is normally exhibited by AC coupled buffers.

The present invention provides, according to one aspect, a self-biasing signal slicer. The slicer may include an input stage coupled to receive an input signal, a current source configured to provide current for the input stage, a self-biased load coupled to the input stage to provide an initial output signal, and an inverter configured to invert the initial output signal to provide a final output signal. The input stage may include a first circuit including a plurality of transistors and a second circuit including a plurality of transistors.

According to another aspect of the invention, a method of slicing an input signal is provided. The method may include the steps of receiving an input signal at an input stage, providing a current to the input stage, generating an initial output signal in conjunction with a self-biased load, and inverting the initial output signal to provide a final output signal. The step of receiving an input signal may include receiving an input signal at an input stage. The input stage may include a first circuit including a plurality of transistors and a second circuit including a plurality of transistors. Additionally, the input stage may include a differential transistor pair, while the self-biased load may include a transistor pair with coupled gate leads. The method may further include the steps of providing a common mode signal at the coupled gate leads, and biasing the current source in accordance with the common mode signal.

Figure 2:
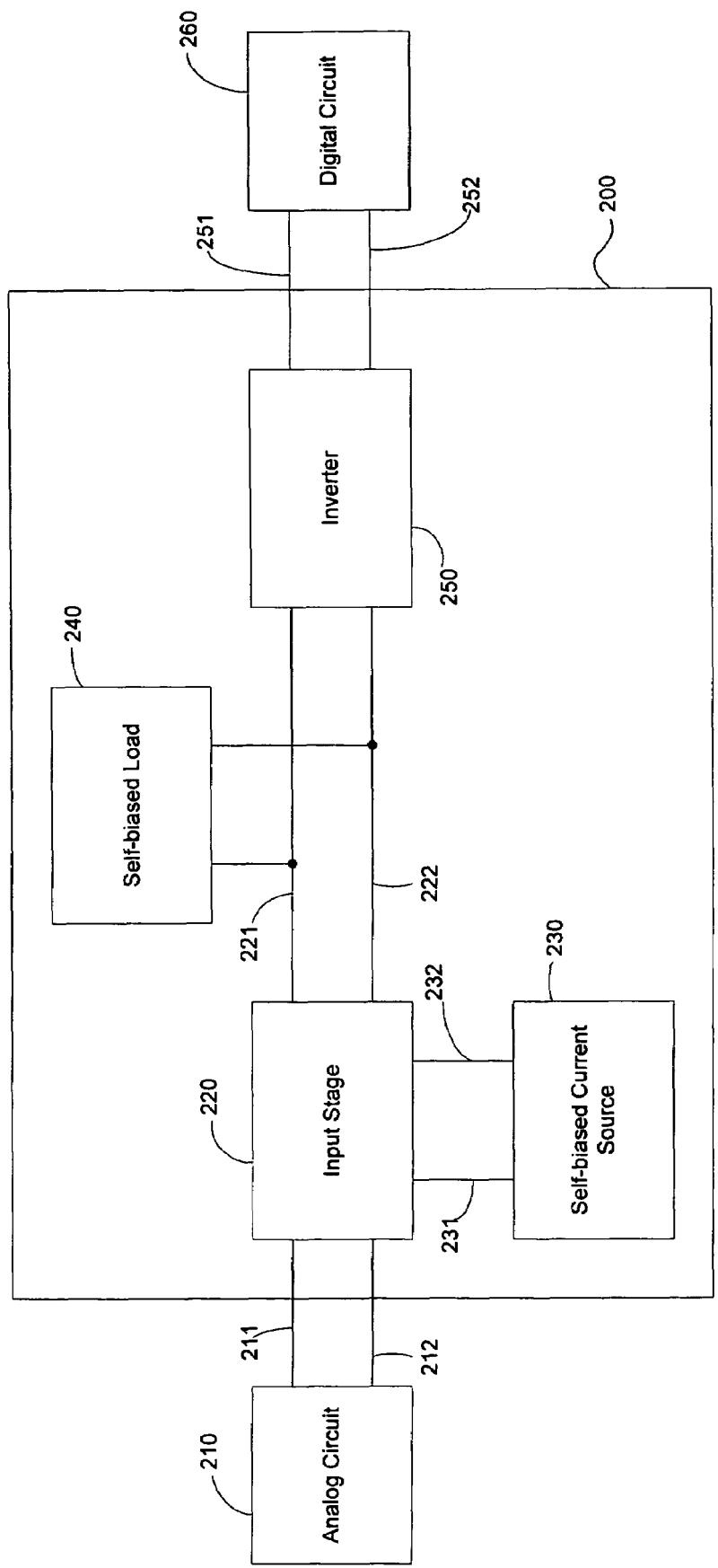
FIG. 2 illustrates a block diagram of a slicer according to one embodiment of the present invention.

FIG. 2 illustrates a block diagram according to one aspect of the present invention. Specifically, FIG. 2 illustrates a slicer 200 with large input common mode range. The slicer 200 includes a differential input stage 220, a self-biased load 240, a self-biased current source 230, and a matched inverter 250. The slicer receives a differential input signal from an analog circuit 210 via input leads 211, 212. The current source 230 provides current for the input stage via leads 231, 232. In conjunction with the self-biased load 240, the input stage 220 generates an initial output signal on leads 221, 222. A common mode connection 270 is provided between the self-biased load 240 and the self-biased current source 230. A matched inverter 250 inverts the signals from leads 221, 222 to provide output signals 251, 252 to a digital circuit 260. The self-biased output signal 221, 222 adjusts the DC level of the inverter 250.

According to an embodiment of the invention, a common mode signal is generated by the self-biased load 240. The common mode signal may control the magnitude of the current provided by the current source 230.

Figure 1:
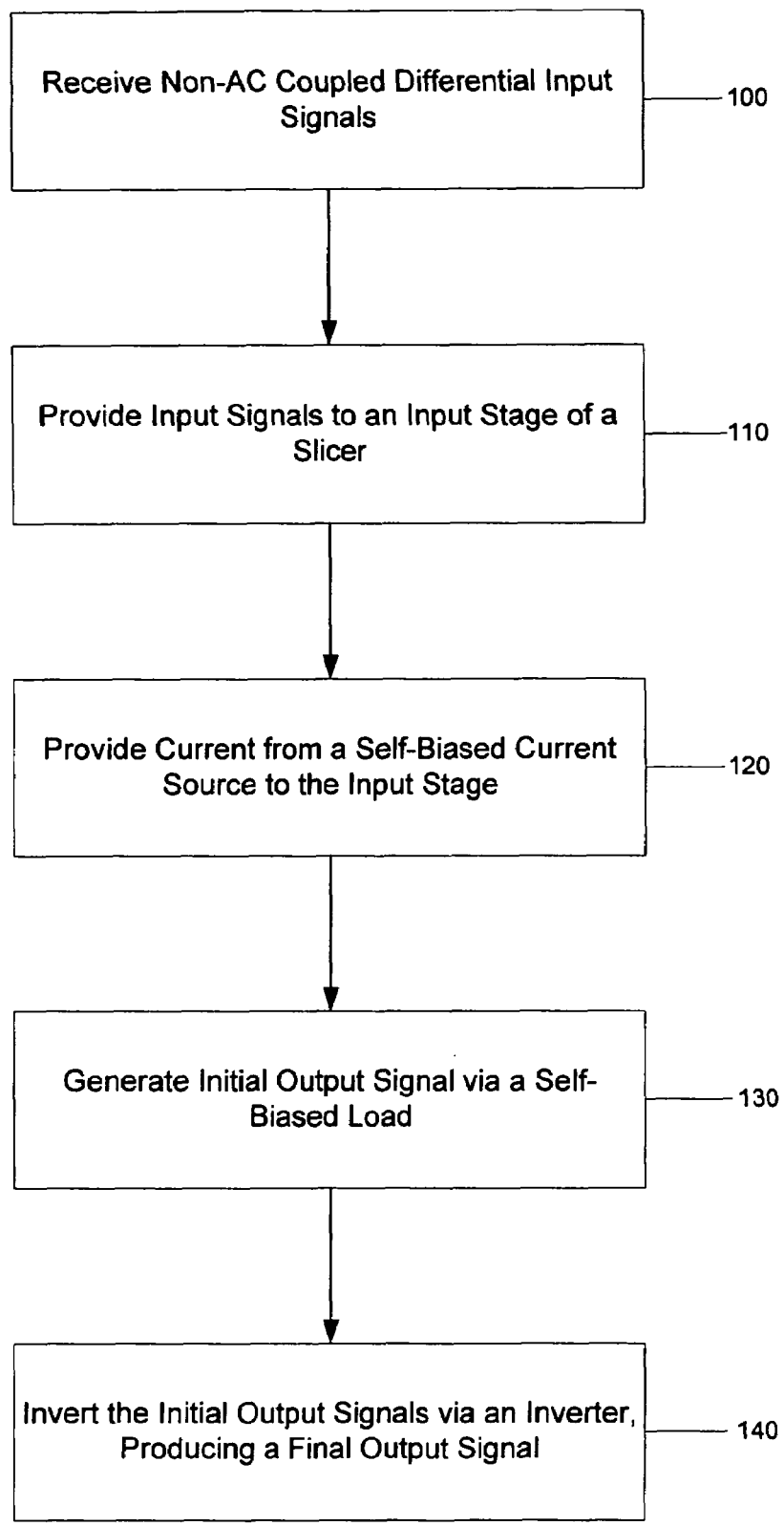
FIG. 1 illustrates a method according to one embodiment of the present invention.

FIG. 1 illustrates a method according to one embodiment of the invention. According to FIG. 1, the method may include the steps of: receiving non-AC coupled differential input signals 100, providing the input signals to an input stage of the slicer 110, providing current from a self-biased current source to the input stage 120, generating an initial output signal via a self-biased load 130, and inverting the initial output signal via an inverter, thereby producing a final output signal 140.

Figure 3:
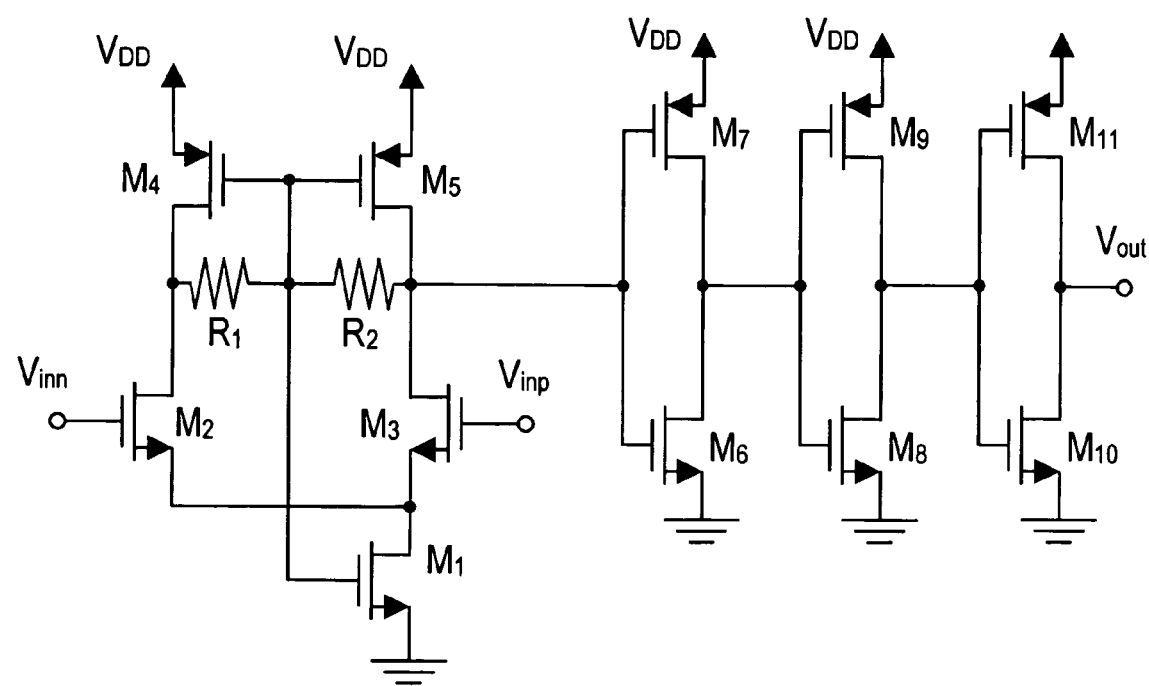
FIG. 3 illustrates a schematic diagram according to one embodiment of the present invention.

FIG. 3 illustrates a schematic diagram of the present invention according to one embodiment. A differential analog input signal, provided via leads $V_{inn}$ and $V_{inp}$, drives a differential transistor pair $M_2$, $M_3$. A current source, including transistor $M_1$, may provide a tail current for the differential transistor pair $M_2$, $M_3$. The load for the differential transistor pair $M_2$, $M_3$ includes resistors $R_1$, $R_2$ and transistors $M_4$ and $M_5$.

The differential output of the differential transistor pair $M_2$, $M_3$ is provided to an inverter. The inverter may comprise a plurality of transistors $M_6$, $M_7$, $M_8$, $M_9$, $M_{10}$, $M_{11}$. The output signal is inverted by the transistors of the inverter producing a rail-to-rail output signal at the output $V_{out}$. The slicer of the present invention, according to the embodiment illustrated in FIG. 3, does not require an AC coupling capacitor at the input since the biasing of the output inverters is accomplished by the self-biased input stage which includes transistors $M_1$–$M_5$ and resistors $R_1$ and $R_2$. Such a configuration presents a significant reduction in die area.

Figure 4:
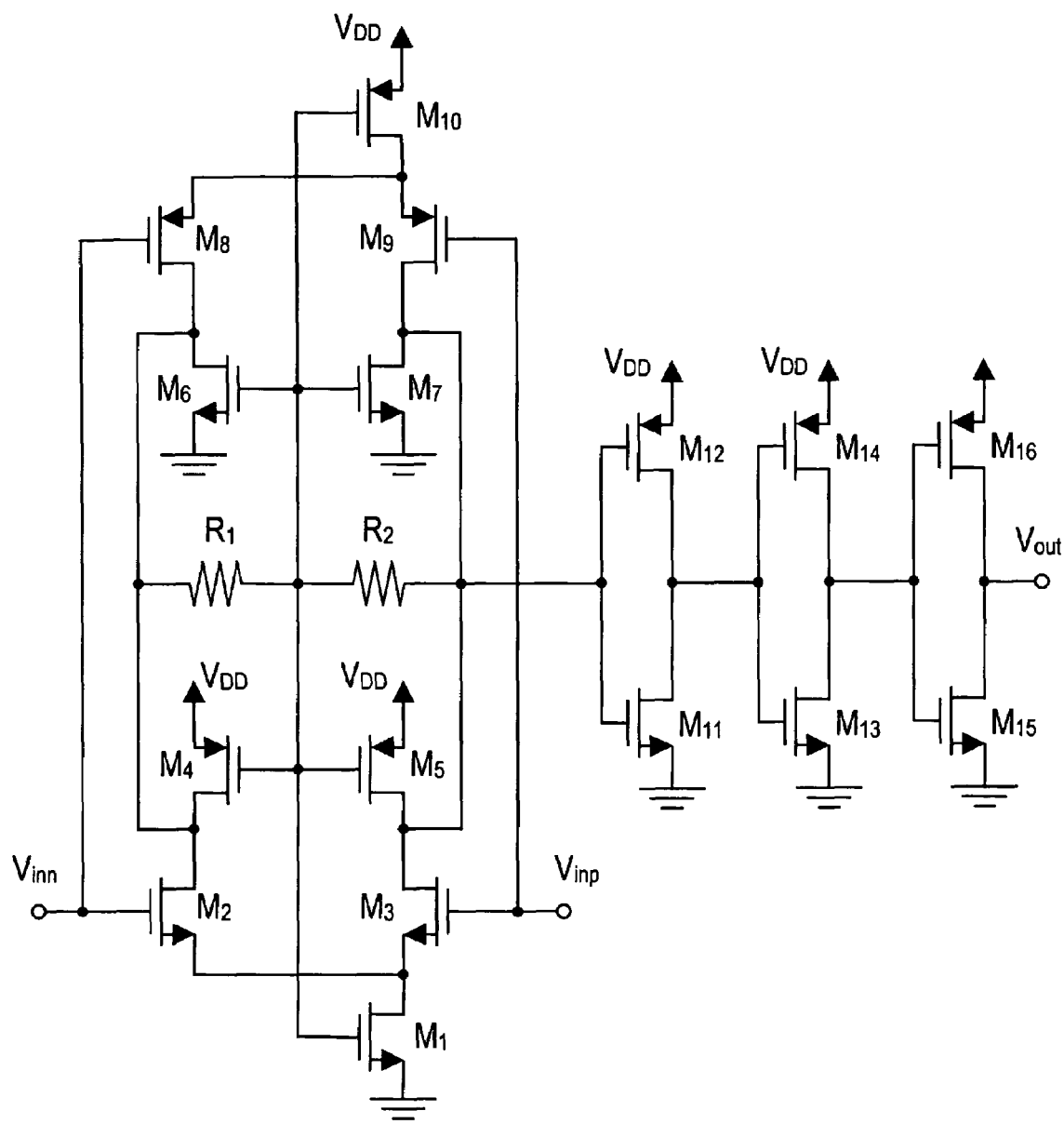
FIG. 4 illustrates a schematic diagram according to another embodiment of the present invention.

FIG. 4 illustrates a schematic diagram of a slicer according to another embodiment of the present invention. A differential analog input signal is provided via leads $V_{inn}$ and $V_{inp}$ and drives a differential transistor pair $M_2$, $M_3$, as well as the complementary differential transistor pair $M_8$, $M_9$. An input stage of the slicer is comprised of a first circuit and a second complementary circuit. The first circuit includes transistors $M_1$–$M_5$, and the second circuit includes transistors $M_6$–$M_{10}$. A common mode signal CM is provided as an average of the differential input signal. An initial output of the input stage is provided to an inverter. The inverter may include transistors $M_{11}$–$M_{16}$. The initial output signal is inverted by the transistors of the inverter producing a rail-to-rail output signal is inverted by the transistors of the inverter producing a rail-to-rail output signal at the output $V_{out}$.

The configuration illustrated in FIG. 4 results in a significant increase in the input common mode range of the slicer. The complementary circuit, comprised of transistors $M_6$–$M_{10}$, may be utilized to accomplish the same task as transistors $M_1$–$M_5$ when the common mode voltage is less than midrail. In other words, when a low common mode input voltage causes transistors $M_1$–$M_5$ to turn off, transistors $M_6$–$M_{10}$ will serve the same function as transistors $M_1$–$M_5$. As a result, the slicer may function like an AC coupled buffer without the use of large AC coupling caps, thereby resulting in a reduction in die area.

The various components of the present invention, as described herein, may be implemented on a single silicon substrate. Alternatively, each of the components may be used in a circuit independently of the other components. As such, a circuit incorporating the slicer of the present invention may include numerous combinations of these components and does not necessarily include all of the components described herein. Additionally, the components of the present invention may be implemented as separate distinct solutions. Further, the present invention may be implemented entirely is software or entirely in hardware. In addition, the present invention may be implemented in a combination of hardware and software. Moreover, the components and functions of the present invention may be connected or coupled in many different ways and may be coupled directly or indirectly.

The various embodiments of the present invention disclosed herein may be incorporated in a variety of circuits. For instance, the slicer may be used in a communications receiver to slice a received signal.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

We claim:

1. A self-biasing signal slicer comprising:
an input stage coupled to receive an input signal, the input stage comprising a first circuit including a first plurality of transistors and a second circuit including a second plurality of transistors;
a current source configured to provide current for the input stage;
a self-biased load coupled to the input stage to provide an initial output signal, wherein the self-biased load comprises a transistor pair with coupled gate leads and the self-biased load provides a common mode signal at the coupled gate leads; and
an inverter configured to invert the initial output signal to provide an output signal.

2. The slicer of claim 1, wherein the second circuit is utilized when a common mode voltage is less than a midrail voltage.

3. The slicer of claim 1, wherein the input stage comprises a differential transistor pair.

4. The slicer of claim 3, wherein the current source is coupled to source leads of the differential transistor pair.

5. The slicer of claim 3, wherein the self-biased load is coupled to drain leads of the differential transistor pair.

6. The slicer of claim 1, wherein the inverter is matched with the current source and the self-biased load.

7. A method of slicing an input signal, the method comprising the steps of:
receiving an input signal at an input stage;
providing a current to the input stage;
generating an initial output signal which is coupled with a self-biased load, the self-biased load comprising a transistor pair with coupled gate leads; and
inverting the initial output signal to provide a final output signal;
wherein the step of receiving an input signal comprises receiving an input signal at an input stage comprising a first circuit including a plurality of transistors and a second circuit including a plurality of transistors,
wherein the method further comprises providing a common mode signal at the coupled gate leads and biasing the current source in accordance with the common mode signal.

8. The method of claim 7, wherein the step of receiving an input signal comprises receiving an input signal at an input stage comprising a differential transistor pair.

9. The method of claim 7, further comprising matching the inverter with the current source and the self-biased load.

10. A self-biasing signal slicer comprising:
receiving means for receiving an input signal at an input stage;
current source means for providing a current to the input stage;
generating means for generating an initial output signal in conjunction with a self-biased load comprising a transistor pair with coupled gate leads; and
inverting means for inverting the initial output signal to provide a final output signal;
wherein the receiving means comprises means for receiving an input signal at an input stage, and wherein said input stage comprises a first circuit including a first plurality of transistors and a second circuit including a second plurality of transistors and
wherein the slices comprises means for providing a common mode signal at the coupled gate leads and biasing the current source in accordance with the common mode signal.

* * * * *